(12) United States Patent
Heyne et al.

(10) Patent No.: US 6,584,021 B2
(45) Date of Patent: Jun. 24, 2003

(54) SEMICONDUCTOR MEMORY HAVING A DELAY LOCKED LOOP

(75) Inventors: Patrick Heyne, München (DE); Thomas Hein, München (DE); Torsten Partsch, Chapel Hill, NC (US); Marx Thilo, Villingen-Schwenningen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/047,824

(22) Filed: Jan. 15, 2002

(65) Prior Publication Data

US 2002/0093855 A1 Jul. 18, 2002

(30) Foreign Application Priority Data

Jan. 15, 2001 (DE) .......................................... 101 01 553

(51) Int. Cl.[7] ................................................. G11C 7/00
(52) U.S. Cl. ................... 365/194; 365/233; 365/189.05
(58) Field of Search ................................. 365/194, 233, 365/189.05

(56) References Cited

U.S. PATENT DOCUMENTS

| | | | |
|---|---|---|---|
| 5,990,730 A | | 11/1999 | Shinozaki |
| 5,995,424 A | * | 11/1999 | Lawrence et al. .......... 365/194 |
| 6,088,255 A | | 7/2000 | Matsuzaki et al. |
| 6,101,152 A | * | 8/2000 | Farmwald et al. .......... 365/233 |
| 6,373,308 B1 | * | 4/2002 | Nguyen ...................... 327/161 |
| 6,487,648 B1 | * | 11/2002 | Hassoun ...................... 711/167 |

OTHER PUBLICATIONS

"Committee Letter Ballot JC–42.3–99–081", JEDEC, Version 2.0C, 1999, pp. 1 and 4.

* cited by examiner

Primary Examiner—Huan Hoang
(74) Attorney, Agent, or Firm—Laurence A. Greenberg; Werner H. Stemer; Gregory L. Mayback

(57) ABSTRACT

A synchronous semiconductor memory containing dynamic memory cells has a delay locked loop in order to synchronize a clock signal which actuates data output drivers with an externally supplied clock signal. An updating of the delay locked loop is suppressed during a Read state of the semiconductor memory. An appropriate control signal is produced by a state machine and is supplied to the delay locked loop. The synchronization of the data output with the supplied clock signal can be achieved in a precise manner and requires only simple circuitry.

7 Claims, 1 Drawing Sheet

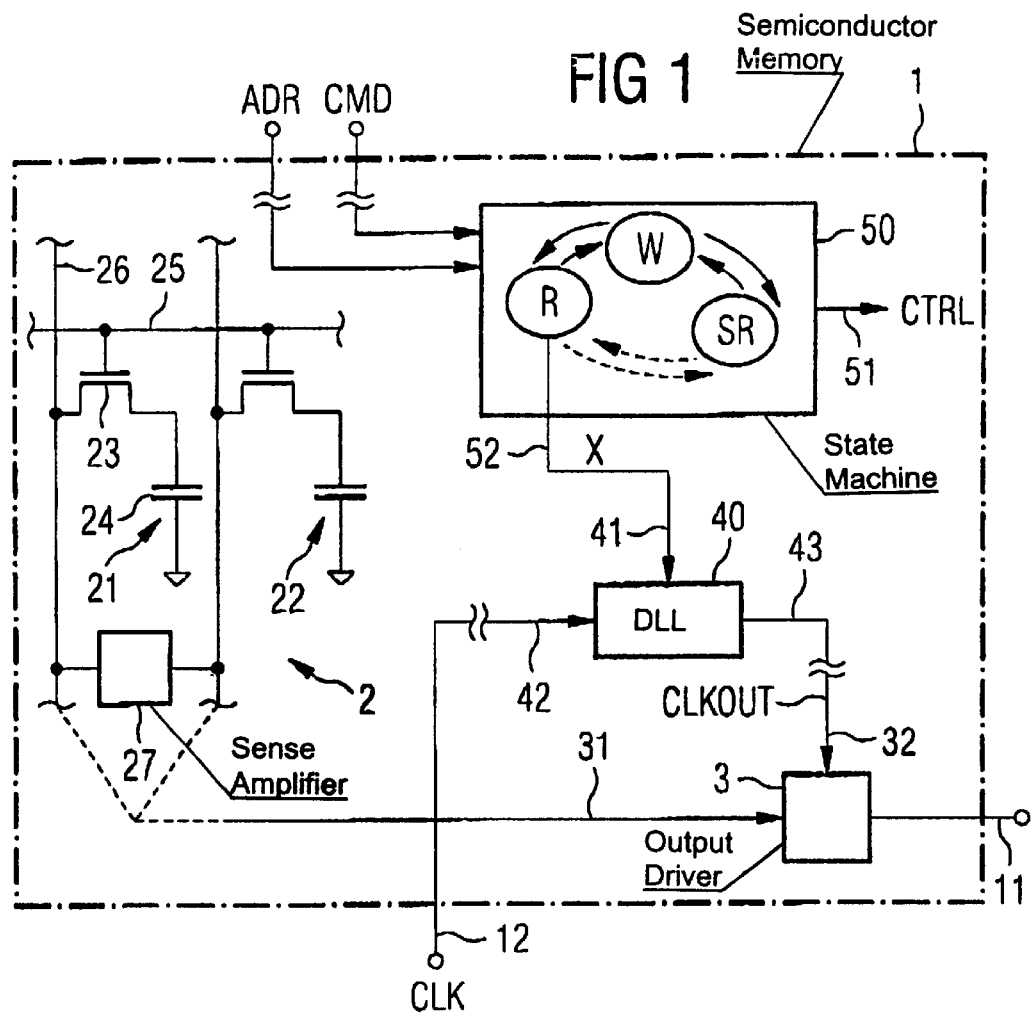
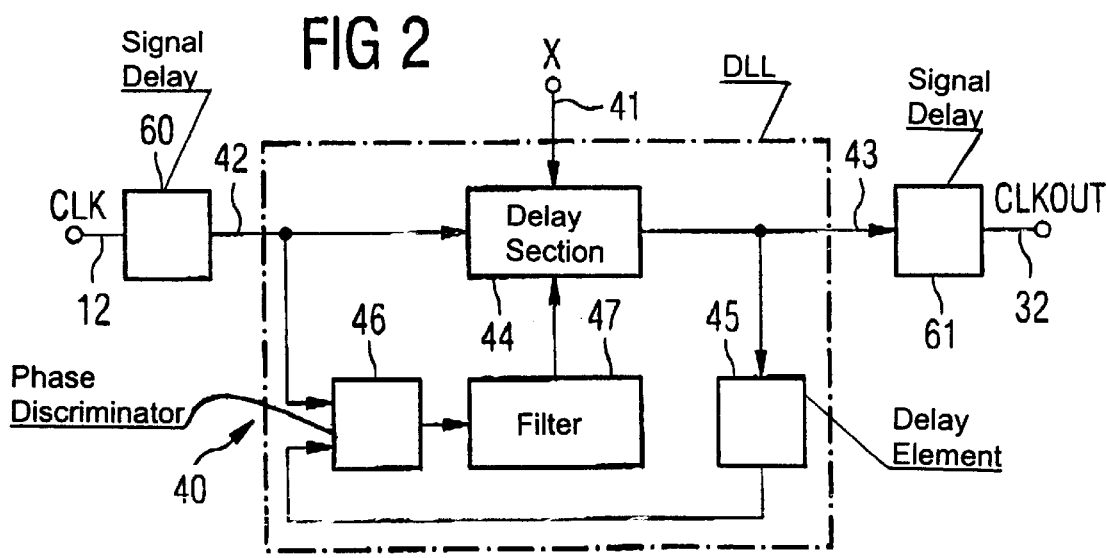

SEMICONDUCTOR MEMORY HAVING A DELAY LOCKED LOOP

BACKGROUND OF THE INVENTION

FIELD OF THE INVENTION

The invention relates to a semiconductor memory having a memory cell array which includes dynamic memory cells. The semiconductor memory has various operating states. A delay locked loop converts an input clock signal into a delayed output clock signal. On the basis of this delayed output clock signal, data values are provided in a clocked manner at an output connection.

Synchronously operating semiconductor memories, in particular SDRAMs (Synchronous Dynamic Random Access Memories), are operated cyclically, i.e. in a clocked manner. The data values read from the memory are available in sync with a clock signal applied to the semiconductor memory externally. In the case of DDR SDRAMs (DDR: Double Data Rate), a data value may be available both on the rising edge and on the falling edge.

Signal paths and switching stages inside chips mean that operating clocks derived from externally supplied clock signals have different phase relationships with respect to the supplied clock signal at different points within the semiconductor memory. A critical factor is the actuation of the data output driver, to which, according to the standardized specification, the data value which is to be output needs to be applied in sync with the clock signal supplied at another point. For this reason, the semiconductor memory contains a delay locked loop which ensures that the clock signal controlling the output driver is available in sync with the externally applied clock signal, and, in particular, the edges of the output data signal match the edges of the supplied clock signal. The delay locked loop uses a suitable control loop to delay a clock signal derived from the external clock signal such that the clock edges controlling the data output driver synchronously match the clock edges of the external clock signal.

The delay times inside a chip vary during operation. By way of example, temperature changes may arise which may be caused by changing ambient temperature or the change from standby mode to normal mode with a relatively high consumed power loss. To be able to continue to provide the output data in sync with the externally supplied clock signal, it is necessary to adjust the delay produced by the delay locked loop.

The application note "Committee Letter Ballot", JC-42.3-99-081, Item 986, May 10, 1999 issued by the standardization committee JEDEC (Joint Electronic Devices Engineering Council) Solid State Technology Association proposes adjusting the delay locked loop during a cycle for refreshing the dynamic memory cells (Autorefresh). Since refresh cycles require up to 15.6 μs, great demands need to be made one the thermal stability of the delay locked loop. One problem is that, in particular operating states, the demands on the synchronism of the data which are output may be violated.

U.S. Pat. No. 5,990,730 describes a semiconductor memory in which the delay time of a delay locked loop can be adjusted. Immediately after the supply voltage has been applied, the delay time of a delay locked loop is finely adjusted on the basis of a test current produced from the semiconductor memory. The adjustment process is ended again immediately after the supply voltage has been applied, and the adjustment then remains unchanged.

U.S. Pat. No. 6,080,255 describes a semiconductor memory in which the delay time of a delay locked loop is altered in steps of different size. The size of the steps is chosen on the basis of the operating state in order to achieve the locked state as quickly as possible when changing over from standby mode to normal mode.

SUMMARY OF THE INVENTION

It is accordingly an object of the invention to provide a semiconductor memory which overcomes the above-mentioned disadvantages of the heretofore-known semiconductor memories of this general type and which has an increased operational reliability with the lowest possible circuit complexity. In particular, it should be possible to provide the output data using synchronous timing under as many operating conditions as possible, always adhering to the demanded specification.

With the foregoing and other objects in view there is provided, in accordance with the invention, a semiconductor memory, including:

a memory cell array including dynamic memory cells;

an output connection operatively connected to the memory cell array for outputting data values stored in the dynamic memory cells;

a state machine selectively having an operating state Read, Write or Refresh and having a signal connection providing a control signal for displaying the operating state Read;

a delay locked loop operatively connected to the state machine, the delay locked loop receiving an input clock signal and providing a delayed output clock signal, the delay locked loop having a signal connection for receiving the control signal from the state machine, the delay locked loop being configured to be actuated by the control signal in order to suppress a change in a delay time between the input clock signal and the delayed output clock signal during the operating state Read; and an output driver operatively connected to the delay locked loop, the output driver being configured to be actuated by the delayed output clock signal in order to provide, at the output connection, data values read from the dynamic memory cells in sync with the delayed output clock signal.

In other words, the object of the invention is achieved through the use of a semiconductor memory including: a memory cell array containing dynamic memory cells; a state machine which has one of the operating states Read, Write and Refresh, and a signal connection with a control signal applied to it in order to display the operating state Read; a delay locked loop to whose input an input clock signal can be supplied and which produces a delayed output clock signal; an output driver which can be actuated by the delayed output clock signal in order to provide data values read from the memory cells in the memory cell array at an output connection of the semiconductor memory in sync with the output clock signal; a signal connection for the delay locked loop, which can be actuated by the control signal produced by the state machine in order to suppress altering the delay time between the input clock signal and the delayed output clock signal from the delay locked loop during the operating state Read.

In the semiconductor memory according to the invention, the delay locked loop can be adjusted in all operating states except in the Read mode. Readjustment of the clock signal controlling the output driver on the basis of changes in the delay characteristics within the semiconductor memory is therefore possible more often than in the above-mentioned application note from JEDEC. This means that the delay locked loop can be matched more closely to the synchronism stipulated by the clock signal applied to the semiconductor memory externally. Changes in the delay time of the internal switching stages on account of rapid changes in temperature can also be compensated for. Nevertheless, there is the assurance that the delay locked loop is not adjusted when data values are being output, in order to prevent sudden phase changes during data output.

The output buffer controlled cyclically, i.e. in a clocked manner, by the delay locked loop is connected to the data signal path which provides the data stored in the memory cell array of the semiconductor memory. The output buffer provides the data either on the rising edge (according to SDRAM standard) or on the rising and falling edges (according to DDR SDRAM standard).

The memory cells in the semiconductor memory are dynamic memory cells which lose the stored charge, representing the data value to be stored, on account of leakage currents. Such memory cells include a transistor for selecting the memory cell and a capacitor for storing charge. To compensate for the charge losses in the storage capacitor, a refresh cycle is performed which reads the data content of the memory cells and accordingly reinforces the stored quantity of charge.

The semiconductor memory can be in a plurality of operating states, for example in the Standby operating state, Autorefresh mode, Read and Write state, Precharge state, Bank-Active state etc. The respective operating state currently adopted by the semiconductor memory is monitored and signalled by a state machine. The state machine evaluates signal states inside the memory and externally applied operating demands and work commands, then ascertains the next state to which the memory is to be changed over and produces the control signals required for this purpose. For the present invention, the Read operating state is important, during which adjustment of the delay locked loop is suppressed. In all other operating states, the delay locked loop can be adjusted and can thus react to changes in the delay time inside the chip, for example on account of temperature fluctuations. The state machine according to the invention evaluates addresses applied to the semiconductor memory externally which specify memory cells, and also operating commands, for example read or write commands or commands for refreshing the memory cell array, etc. The state machine can alternate at least between the operating states Read, Write and Refresh.

The delay locked loop has a controlled section which includes a delay unit whose delay time can be controlled. A feedback loop branches off at the end of the controlled section and contains a delay element whose delay time is characteristic of the chip-internal delay between the point at which the externally applied clock is fed in and the delay path up to the output buffer. A phase detector compares the phase between the input of the output buffer and the output of the delay element in the feedback path. The output of the phase detector controls a filter whose output signal adjusts the delay time of the controlled path. The effect of the control is that the phase difference between the signals at the input of a phase detector is regulated out to zero as far as possible.

According to another feature of the invention, the output driver is coupled to the dynamic memory cells via a data signal path for providing the data values read from the memory cells at the output connection.

According to yet another feature of the invention, the output driver provides, at the output connection, the data values read from the dynamic memory cells in sync with the rising edge or the falling edge of the delayed output clock signal.

According to a further feature of the invention, the dynamic memory cells each include a transistor and a capacitor coupled to the data signal path via the transistor.

According to another feature of the invention, the state machine is configured to receive an address representing one of the dynamic memory cells and an operating command. The address and the operating command are provided as external signals to the semiconductor memory. The state machine adopts a current operating state based on a preceding operating state, on the address representing the one of the dynamic memory cells, and on the operating command.

According to another feature of the invention, the delay locked loop has an input connection, an output connection, and a signal section with a controllable delay time connected between the input connection of the delay locked loop and the output connection of the delay locked loop. The delay locked loop has a delay element having an input connected to the output connection of the delay locked loop, a phase detector connected, on an input side thereof, to the input connection of the delay locked loop and to an output of the delay element, and the delay locked loop has a filter having an input connected to the phase detector and the filter has an output connected to the signal section for controlling a delay time. The delay locked loop is configured such that a change of the controllable delay time of the signal section is selectively turned on and turned off via the signal connection of the delay locked loop.

According to another feature of the invention, first circuit elements are connected between a connection for the input clock signal and the input connection of the delay locked loop. Second circuit elements are connected between the output connection of the delay locked loop and the output driver. The delay element has a delay time coupled to the delay time of the first circuit elements and to the delay time of the second circuit elements in order to synchronize the input clock signal with the data values read out at the output connection operatively connected to the memory cell array for outputting the data values stored in the dynamic memory cells.

Other features which are considered as characteristic for the invention are set forth in the appended claims.

Although the invention is illustrated and described herein as embodied in a semiconductor memory having a delay locked loop, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a detail of a semiconductor memory according to the invention; and FIG. 2 is a block diagram of a delay locked loop of a semiconductor memory according to the invention.

DESCRIPTION OF THE PREFERRED EMBODIMENTS

Referring now to the figures of the drawings in detail and first, particularly, to FIG. 1 thereof, there is shown a part of a memory circuit configuration containing functional elements of a semiconductor memory, in particular of a DDR SDRAM, which are relevant to the invention. The semiconductor memory 1 includes a memory cell array 2 in which the memory cells 21, 22 are shown by way of example. The memory cells are provided in rows and columns and each include a selection transistor 23 and a memory cell 24. The selection transistor 23 is turned on by a word line 25. This connects the memory cell 24 to a bit line 26 in order to read the data value via a sense amplifier 27. Connected downstream of the sense amplifier 27 are also a multiplicity of other amplifiers and functional devices in the data signal path in order to be able to output the data stored in the memory cells at an output connection 11 of the semiconductor memory 1. Finally, the data signal path ends with the data signal line 31, which is fed into an output driver 3 whose output has the data output connection 11 connected to it. The output driver 3 provides the data signal having the demanded current driver capability, in order to be able to drive lines connected to the output connection 11, for example on a circuit board.

Data are input and output on the DDR SDRAM in sync with the clock signal CLK applied externally at a connection 12. The lines and amplifiers which run within the semiconductor memory 1 and pass on the clock signal CLK within the chip cause a delay. A delay locked loop 40 or DLL produces an output clock signal CLKOUT which controls the output driver 3 in a clocked manner. The task of the DLL 40 is that of matching the edges of the externally supplied clock CLK and the edges of the output driver 3. As discussed in detail further below, the DLL simulates the delay time of the clock signal CLK from the point of supply at the connection 12 to the appropriate connection 32 on the output driver 3 and shifts the edges of the clock signal output by the DLL 40 such that the data signal on the connection 11 is finally in sync with the signal CLK.

The DLL 40 has an input connection 41 which is used to supply a control signal on the basis of which it is possible to control the adjustability of the delay time for the DLL 40. This means that, if the control signal on the connection 41 has a first state, the control loop formed within the DLL 40 is closed and the delay time between the clock inputs and outputs 42 and 43 of the DLL 40 changes; if the control signal on the connection 41 has the complementary other state, such an adjustment of the delay time is prevented.

The control signal X on the connection 41 of the DLL 40 is produced by a state machine 50. On the basis of the state which is currently present and of its input signals, the state machine 50 adopts a subsequent state and, on output connections 51, produces control signals CTRL which can control the functional sequences in the semiconductor memory 1 which correspond to the operating states. In the present case, the states of the state machine 50 which are relevant in this context are set on the basis of the applied addresses ADR for memory cells which need to be accessed and on the basis of operating commands CMD, for example produced by a processor and applied externally. The state machine 50 has a Read state R, a Write state W and a Self-Refresh state SR. During the Read state R, data are read from the memory cell array 2 and are output to the output connection 11 via the output driver 3. During the Write state, externally applied data are written to the memory cell array 2. During the Self-Refresh state SR, the charge content of the memory cells in the memory cell array 2 is refreshed in order to compensate for leakage current losses. On the basis of predetermined changes or transitions, changeover between the states R, W, SR is effected on the basis of the addresses ADR and commands CMD.

The output connection 52 of the state machine 50 is coupled to the input 41 of the DLL 40. During the Read state R, the control signal X on the connection 52 has a level value which is such that refreshing or updating of the DLL 40 is suppressed. In all other states which can be adopted by the state machine 50, the control signal X on the connection 52 has a level which is such that updating of the DLL 40 is made possible. This ensures that, during a read operation, when data are being output to the output connection 11 via the output driver 3, no sudden phase change arises in the output clock signal CLKOUT. In the other operating states, control of the delay of the clock signals between the connections 42, 43 of the DLL 40 is active, so that the clock signal CLKOUT is synchronized with the input clock CLK. A change in the temperature of the semiconductor chip may result in a shift in the timing relationship between the clock signal CLKOUT and the input clock CLK, so that the DLL 40 needs to be readjusted in order to compensate for the discrepancy from the desired nominal value. If data currently appear on the output connection 11, then, if such readjustment takes place during reading, the time window during which data are present in a valid form would be shortened. To prevent this, the invention suppresses any updating of the DLL 40 during the Read state R.

FIG. 2 shows an exemplary embodiment of a delay locked loop or DLL 40. Elements corresponding to FIG. 1 have been provided with the same reference symbols in FIG. 2. The circuit blocks 60, 61 represent the signal delay times between the input connection 12 of the semiconductor memory 1 and the input 42 of the DLL and between the output connection 43 of the DLL and the clock input 32 of the output driver 3. The DLL includes a delay section 44 whose delay time can be set. At the output of the delay section 44, a feedback path branches off. This feedback path contains an element 45 which simulates the delay times of the circuit blocks 60, 61. A phase discriminator 46 compares the output signals from the delay element 45 with the input signal for the controllable delay element 44. A filter 47, e.g. a low-pass filter, converts the output signal from the phase discriminator 46 into a control signal for the delay section 44. The effect of the control is that the phase difference between the input signals for the phase detector 46 is regulated out to zero as far as possible. The control connection 41 of the DLL 40 is connected to the delay section 44. The control signal X makes the delay time of the delay section 44 controllable in a first state and uncontrollable in a second state. On the basis of the signal states of the control signal X, adjustment or updating of the DLL 40 is then enabled or suppressed.

We claim:

1. A semiconductor memory, comprising:

a memory cell array including dynamic memory cells;

an output connection operatively connected to said memory cell array for outputting data values stored in said dynamic memory cells;

a state machine selectively having an operating state selected from the group consisting of Read, Write and Refresh and having a signal connection providing a control signal for displaying the operating state Read;

a delay locked loop operatively connected to said state machine, said delay locked loop receiving an input clock signal and providing a delayed output clock signal, said delay locked loop having a signal connection for receiving the control signal from said state machine, said delay locked loop being configured to be actuated by the control signal in order to suppress a change in a delay time between the input clock signal and the delayed output clock signal during the operating state Read; and an output driver operatively connected to said delay locked loop, said output driver being configured to be actuated by the delayed output clock signal in order to provide, at said output connection, data values read from said dynamic memory cells in sync with the delayed output clock signal.

2. The semiconductor memory according to claim 1, including a data signal path, said output driver being coupled to said dynamic memory cells via said data signal path for providing the data values read from said memory cells at said output connection.

3. The semiconductor memory according to claim 2, wherein the delayed output clock signal has a rising edge and a falling edge, said output driver provides, at said output connection, the data values read from said dynamic memory cells in sync with one of the rising edge and the falling edge of the delayed output clock signal.

4. The semiconductor memory according to claim 1, wherein said dynamic memory cells each include a transistor and a capacitor coupled to said data signal path via said transistor.

5. The semiconductor memory according to claim 1, wherein:
said state machine is configured to receive an address representing one of said dynamic memory cells and an operating command, the address and the operating command are provided as external signals; and
said state machine adopts a current operating state based on a preceding operating state, on the address representing said one of said dynamic memory cells, and on the operating command.

6. The semiconductor memory according to claim 1, wherein:
said delay locked loop has an input connection, an output connection, and a signal section with a controllable delay time, said signal section is connected between said input connection of said delay locked loop and said output connection of said delay locked loop;
said delay locked loop has a delay element having an input connected to said output; connection of said delay locked loop, a phase detector connected, on an input side thereof, to said input connection of said delay locked loop and to an output of said delay element, and said delay locked loop has a filter having an input connected to said phase detector and said filter has an output connected to said signal section for controlling a delay time; and
said delay locked loop is configured such that a change of the controllable delay time of said signal section is selectively turned on and turned off via said signal connection of said delay locked loop.

7. The semiconductor memory according to claim 6, including:
first circuit elements connected between a connection for the input clock signal and said input connection of said delay locked loop, said first circuit elements having a delay time;
second circuit elements connected between said output connection of said delay locked loop and said output driver, said second circuit elements having a delay time; and
said delay element has a delay time corresponding to the delay time of said first circuit elements and to the delay time of said second circuit elements in order to synchronize the input clock signal with the data values read out at said output connection operatively connected to said memory cell array for outputting the data values stored in said dynamic memory cells.

* * * * *